(12) United States Patent
Nagari et al.

(10) Patent No.: US 6,184,811 B1
(45) Date of Patent: Feb. 6, 2001

(54) DOUBLE-SAMPLED ΣΔ MODULATOR OF SECOND ORDER HAVING A SEMI-BILINEAR ARCHITECTURE

(75) Inventors: Angelo Nagari, Cilavegna; Germano Nicollini, Piacenza, both of (IT)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/146,019

(22) Filed: Sep. 2, 1998

(30) Foreign Application Priority Data

Sep. 5, 1997 (EP) .................................................. 97830440

(51) Int. Cl.[7] .................................................. H03M 3/00
(52) U.S. Cl. ............................................. 341/143; 341/172
(58) Field of Search ................................. 341/143, 172, 341/155, 144; 330/258, 107, 9

(56) References Cited

U.S. PATENT DOCUMENTS

| | | | |
|---|---|---|---|
| 4,599,573 | * 7/1986 | Senderowicz | 330/107 |
| 4,633,223 | * 12/1986 | Senderowicz | 340/347 |
| 4,633,425 | * 12/1986 | Senderowicz | 364/825 |
| 5,001,725 | * 3/1991 | Senderowicz | 375/28 |
| 5,220,286 | * 6/1993 | Nadeem | 330/9 |
| 5,392,043 | 2/1995 | Ribner | 341/143 |
| 5,914,638 | * 6/1999 | He | 330/258 |

OTHER PUBLICATIONS

T. V. Burmas et al., "A Second–Order Double–Sampled Delta–Sigma Modulator Using Additive–Error Switching", *IEEE Journal of Solid–State Circuits,* vol. 31, No. 3, (Mar. 1, 1996), pp. 284–293.

D. Senderowicz, "Low–Voltage Double–Sampled Sigma Delta Convertors", *IEEE International Solid–State Circuits Conference,* (Feb. 6, 1997), pp. 310–211, 458.

Burmas et al., A Second Order Double–Sampled Delta–Sigma Modulator, IEEE Journal of Solid State Circuits, pp. 195–198.*

* cited by examiner

*Primary Examiner*—Peguy JeanPierre
(74) *Attorney, Agent, or Firm*—Theodore E. Galanthay; Allen, Dyer, Doppelt, Milbrath & Gilchrist, P.A.

(57) ABSTRACT

A second-order double-sampled ΣΔ analog/digital converter uses two fully differential switched-capacitor integrators coupled in cascade. The first integrator has a fully-floating double-sampled, bilinear switched capacitor input structure. The second integrator has a double-sampled lossless discrete integrator (LDI) switched-capacitor input structure. The converter achieves an excellent SNR with a reduced number of switches for low power consumption.

24 Claims, 2 Drawing Sheets

ΣΔ double-sampled modulator
semi-bilinear

DOUBLE-SAMPLED ΣΔ MODULATOR OF SECOND ORDER HAVING A SEMI-BILINEAR ARCHITECTURE

FIELD OF THE INVENTION

The invention relates to Sigma-Delta analog/digital converters, and, more particularly, to a second-order double-sampled Sigma-Delta modulator.

BACKGROUND OF THE INVENTION

In second-order Sigma-Delta analog/digital converters, briefly ΣΔ A/D, the analog circuit part is essentially based upon a circuit composed of two integrators (because of the second-order) of the switched-capacitor (SC) type connected in cascade. The output of the last integrator drives the input of a comparator that realizes, through a one-bit (in the majority of cases) D/A converter, a feedback which has repercussions on the same SC integrators. Accordingly, these SC integrators process the difference between the input signal and the feedback signal originating from the D/A feedback.

As in all SC circuits a double-sampled structure may be used to reduce current consumption. This structure is commonly referred to as a Lossless Discrete Integrator (LDI), and it is realized by simply duplicating each switched-capacitor structure and employing complementary control phases of the switches. In this way it is possible to attain the same function while halving the clock frequency that drives the switches. As a consequence, the current in the operational amplifiers can be reduced considerably because the time available for the settling of the amplifiers themselves is doubled. This general concept is illustrated in FIG. 1.

FIG. 2 shows a classical second-order single-sampled ΣΔ modulator. The purpose of this circuit is to assure, in the baseband of the signal to be converted, a satisfactory signal-to-noise ratio. This is done by "shifting" the quantization noise of the converter into a high frequency range. The consequent digital part of the ΣΔ converter will eliminate the high frequency noise by a digital filtering, supplying the data corresponding to the input signal with a resolution (number of bits of the data output by the A/D converter) defined by the signal-to-noise ratio of the same circuit. The resolution of these A/D converters is determined by the ratio between the clock frequency of the SC circuits and the band of the signal to be converted as disclosed, for example, in J. C. Candy: *A use of double integration in sigma delta modulation,* IEEE Transaction on Communications, Vol. COM-33, No. 3, pp. 249–258, March 1985.

The problem of realizing a second-order ΣΔ modulator using double-sampled SC integrators has been approached in different manners. The most serious problem of a double-sampled approach is represented by the aliasing of the high frequency quantization noise in the baseband (the band of interest) caused by mismatches among the switched-capacitors that realize the double-sampled structure as disclosed, for example, in P. J. Hurst. W. J. McIntyre: *Double sampling in switched capacitor delta-sigma A/D converters,* in ISCAS proc., pp. 902–905, New Orleans, May 1990. This aliasing considerably degrades the signal-to-noise ratio (SNR) of the A/D converter to the point of making not viable the use of a double-sampled structure for the realization of a second-order ΣΔ modulator.

To overcome this problem, a first approach, as disclosed, for example, in T. V. Burmas, K. D. Dyer, P. J. Hurst and S. H. Lewis: *A second-order double-sampled delta-sigma modulator using additive-error switching,* IEEE Journal of Solid State Circuits, Vol. SC-31, pp. 284–293, March 1996, which uses a sequential logic which, by considering the "history" of the output signal of the circuit, succeeds in eliminating the aliasing caused by the double-sampled structure. This is done by acting on the switches that realize the feedback in the SC integrators (ΣΔ Modulator with additive-error switching).

However, this known circuit is very complex as it increases considerably both the number of switches and of the needed control signals, as well as the number of switched-capacitors. It has a resulting increase in the area occupied and with the further disadvantage of rendering practically impossible a low supply voltage realization because of the many control signals for the switches that need to be boosted.

A second known approach is disclosed, for example, in D. Senderowicz, G. Nicollini, S. Pernici, A. Nagari, P. Confalonieri and C. Dallavalle: *Low-voltage double-sampled ΣΔ converters,* in ISSCC Dig. of Tech. paper, pp. 210–211. Febuaray 1997. This approach eliminates the aliasing of the high frequency quantization noise by realizing a fully floating structure that converts an eventual switched-capacitor mismatch into a common mode signal (Bilinear ΣΔ Modulator).

The main limitation of this known structure is that of requiring the realization of bilinear SC integrators. Moreover, these bilinear SC integrators increase considerably the internal gains of the circuit, with a consequent reduction of the dynamic range of the SC integrators and a degrading of the signal-to-noise ratio (SNR) by about 6 dB.

SUMMARY OF THE INVENTION

Confronted with this state of the art, a structure has now been found for effectively eliminating the aliasing of the high frequency quantization noise without substantially increasing the internal gains of the circuit, and thereby without degrading the signal-to-noise ratio.

It has been observed that the aliasing caused by the mismatch of the capacitors of a second-order double-sampled ΣΔ modulator is mainly caused by the capacitors used for the first SC integrator, that is, the one that directly processes the input signal to be converted.

It has been found that by using, as the second SC integrator in cascade, a classical double-sampled LDI structure as illustrated in FIG. 1, the SNR of the converter does not degrade appreciably. Instead, as the first integrator a fully-floating structure, similar to that disclosed in the Senderowicz et al. article, is effectively used.

The resulting fully differential structure that exploits the compensation of the error generated by the double-sampled structure of the first integrator by converting such an error signal into a common mode signal and wherein the second integrator is realized in a normal way, has the advantage of reducing the circuit complexity by reducing the number of switched-capacitors. In addition, the inventions remains able to control the aliasing caused by the double-sampled structure and maintains the same internal gains of the circuit as in a classical ΣΔ modulator (see FIG. 2). Accordingly, the SNR figure is substantially unchanged. The ΣΔ modulator in accordance with the present invention may be considered as a semi-bilinear ΣΔ modulator.

DETAILED DESCRIPTION OF THE PREFERRED EMBODIMENTS

Figure 3:
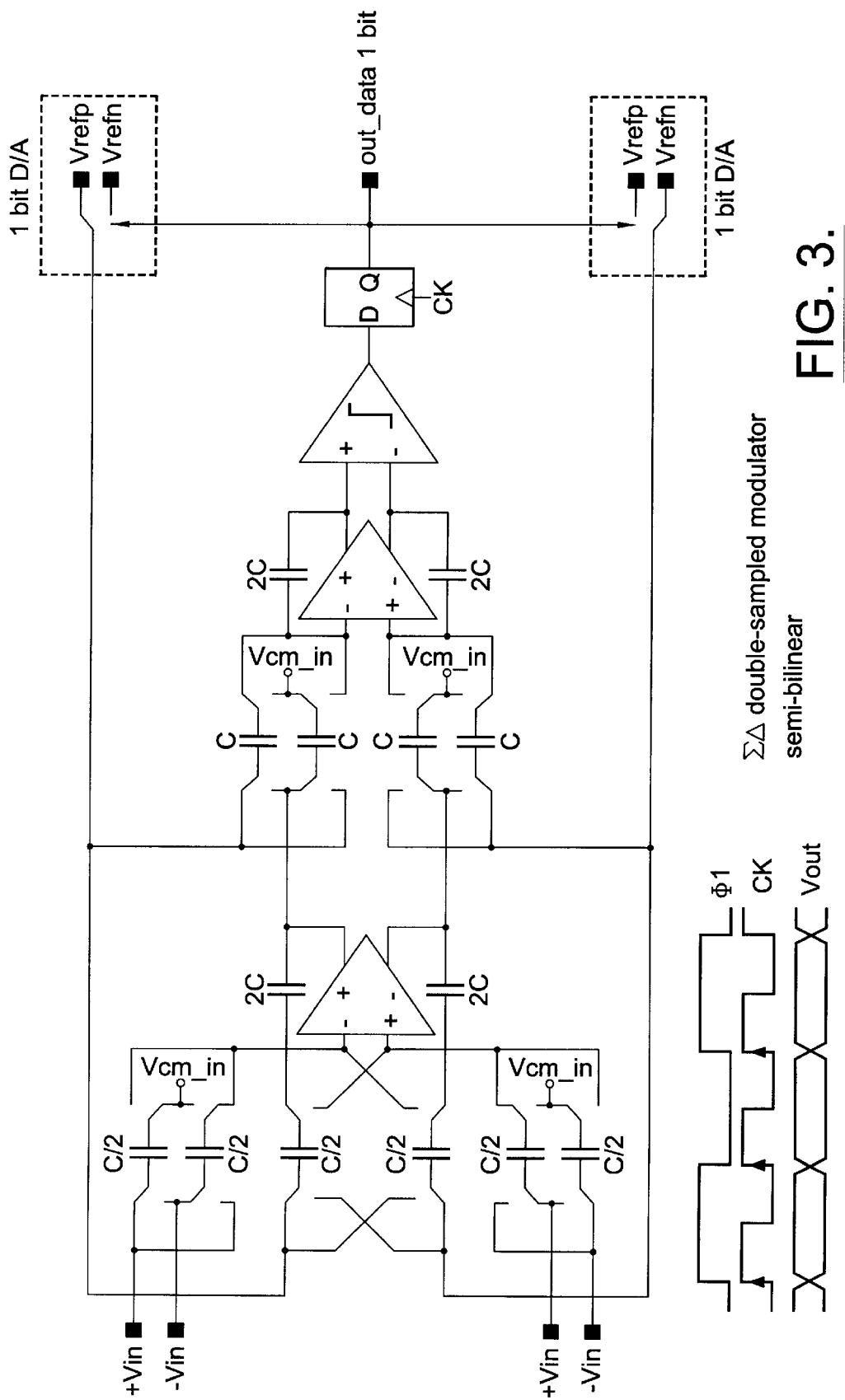
FIG. 3 is a schematic circuit diagram of a second order semi-bilinear ΣΔ modulator of the present invention.

The circuit of a doubled-sampled ΣΔ modulator according to the present invention is depicted in FIG. 3. The first SC integrating stage includes: a double-sampled semi-bileneur input structure that processes the Vin input signal and dynamically fixes the input common mode voltage of the operational amplifier. This is so because one of the two switches between the switched-capacitor and the inputs of the amplifier is connected to the input common mode voltage (Vcm_in) of the amplifier itself. Moreover, this structure realizes a fully-floating bilinear structure for processing the feedback signal of the one-bit D/A (represented by the two voltages +Vref or −Vref) and converting the error signal, caused by the mismatch between the capacitors (C/2) of the first stage into a common mode signal.

In contrast, the second integrating stage is realized according to a classical double-sampled LDI structure that processes both the outputs of the first integrator and the feedback signal produced by the one-bit D/A. The output of the second SC integrator drives the comparator that performs the one-bit analog/digital conversion and creates, by way of an output latch, the input signal (one-bit out_data) for the feedback D/A.

Figure 1:
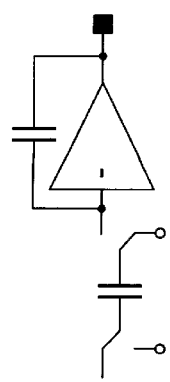
FIG. 1 is a schematic diagram showing, as already described above, the advantage of passing from a single-sampled switched-capacitor structure to an equivalent double-sampled structure as in the prior art.
Figure 2:
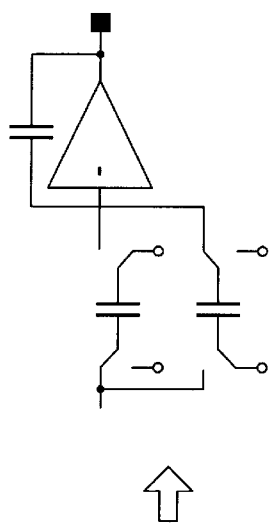
FIG. 2 is a functional schematic diagram of a classical second-order ΣΔ modulator used in an analog/digital converter, as in the prior art.
Figure 2:
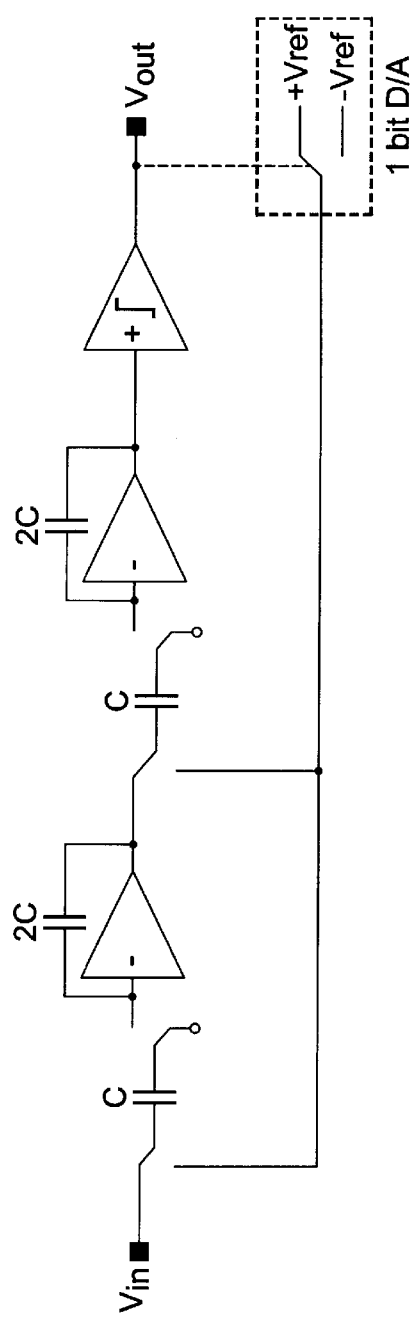

As may be observed in FIG. 3, the gains of the two integrating stages are equal to ½, both for the first and for the second integrator. This is so because the first integrator realizes a bilinear structure which by itself has an intrinsic gain equal to 2. Upon comparing the schemes of FIG. 3 and FIG. 2, it is appreciated how the gains of the two integrators have remained unchanged, thus optimizing the dynamics of the respective operational amplifiers that are used in the two stages and consequently maximizing the SNR figure.

Moreover, the double-sampled ΣΔ semi-bilinear modulator of the invention uses a much smaller number of MOS switches than the known circuits. Therefore the present invention is also suited for "low-voltage" applications because the signals that need to be boosted are just the classical phases of an SC circuit.

That which is claimed is:

1. A second-order double-sampled ΣΔ analog/digital converter comprising:
   first and second fully differential switched-capacitor integrators coupled in cascade;
   said first switched-capacitor integrator comprising a fully-floating double-sampled, bilinear switched-capacitor input structure;
   said second switched-capacitor integrator comprising a double-sampled lossless discrete integrator switched-capacitor input structure.

2. An analog/digital converter according to claim 1, wherein each of said first and second switched-capacitor integrators comprises an operational amplifier.

3. An analog/digital converter according to claim 1, wherein said first and second switched-capacitor integrators each has a gain of one-half.

4. An analog/digital converter according to claim 1, wherein each of said first and second switched-capacitor integrators comprises a respective pair of feedback capacitors.

5. An analog/digital converter according to claim 4, wherein all of said feedback capacitors have a same predetermined capacitance.

6. An analog/digital converter according to claim 5, wherein said fully-floating double-sampled, bilinear switched-capacitor input structure comprises a first plurality of input capacitors all having a capacitance substantially equal to one-fourth the predetermined capacitance of each of said feedback capacitors.

7. An analog/digital converter according to claim 6, wherein said first plurality of capacitors are six in number.

8. An analog/digital converter according to claim 5, wherein said double-sampled lossless discrete integrator switched-capacitor input structure comprises a second plurality of input capacitors all having a capacitance substantially equal to one-half the predetermined capacitance of each of said feedback capacitors.

9. An analog/digital converter according to claim 8, wherein said second plurality of capacitors are four in number.

10. An analog/digital converter according to claim 1, further comprising a comparator connected to an output of said second switched-capacitor integrator.

11. An analog/digital converter according to claim 10, further comprising an output latch connected to an output of said comparator.

12. An analog/digital converter according to claim 11, further comprising first and second one-bit analog-to-digital converters connected to an output of said output latch for providing feedback signals to said first and second switched-capacitor integrators.

13. An analog/digital converter comprising:
   first and second fully differential switched-capacitor integrators coupled in cascade;
   said first switched-capacitor integrator comprising a first operational amplifier, a first pair of feedback capacitors connected to said first operational amplifier, and a first plurality of input capacitors and associated switches connected to said first operational amplifier to define a fully-floating double-sampled, bilinear switched-capacitor input structure;
   said second switched-capacitor integrator comprising a second operational amplifier, a second pair of feedback capacitors connected to said second operational amplifier, and a second plurality of input capacitors and associated switches connected to said second operational amplifier to define a double-sampled lossless discrete integrator switched-capacitor input structure.

14. An analog/digital converter according to claim 13, wherein said first and second switched-capacitor integrators each has a gain of one-half.

15. An analog/digital converter according to claim 13, wherein all of said feedback capacitors have a same predetermined capacitance.

16. An analog/digital converter according to claim 15, wherein said first plurality of input capacitors all have a capacitance substantially equal to one-fourth the predetermined capacitance of each of said feedback capacitors.

17. An analog/digital converter according to claim 15, wherein said second plurality of input capacitors all have a capacitance substantially equal to one-half the predetermined capacitance of each of said feedback capacitors.

18. An analog/digital converter according to claim 13, wherein said first plurality of capacitors are six in number.

19. An analog/digital converter according to claim 13, wherein said second plurality of capacitors are four in number.

20. An analog/digital converter according to claim 13, further comprising a comparator connected to an output of said second switched-capacitor integrator.

21. An analog/digital converter according to claim 20, further comprising an output latch connected to an output of said comparator.

22. An analog/digital converter according to claim 21, further comprising first and second one-bit analog-to-digital converters connected to an output of said output latch for providing feedback signals to said first and second switched-capacitor integrators.

23. A method for making an analog/digital converter comprising the steps of:

forming a first fully differential switched-capacitor integrator comprising a fully-floating double-sampled, bilinear switched-capacitor input structure; and forming a second fully differential switched-capacitor integrator comprising a double-sampled lossless discrete integrator switched-capacitor input structure, the second switch-capacitor integrator being connected to the first switched-capacitor integrator.

24. A method according to claim 23, further comprising the step of forming each of the first and second switched-capacitor integrators to have a gain of one-half.

* * * * *

UNITED STATES PATENT AND TRADEMARK OFFICE
CERTIFICATE OF CORRECTION

PATENT NO. : 6,184,811 B1
DATED : February 6, 2001
INVENTOR(S) : Nagari et al.

It is certified that error appears in the above-identified patent and that said Letters Patent is hereby corrected as shown below:

Item 56, References Cited:
Delete: "D. Senderowicz, "Low-Voltage Double –Sampled Sigma Delta Converters", *IEEE International Solid-State Circuits Conference*, (Feb. 6, 1997), pp. 310-211, 458"
Substitute: -- D. Senderowicz, "Low-Voltage Double-Sampled Sigma Delta Converters", IEEE International Solid-State Circuits Conference, (Feb. 6.1997), pp.210-211, 458 --

Column 3,
Line 12, Delete: "semi-bileneur"
Substitute: -- semi-bilinear --

Signed and Sealed this

Eleventh Day of September, 2001

Attest:

NICHOLAS P. GODICI
*Attesting Officer*     *Acting Director of the United States Patent and Trademark Office*